(12) United States Patent
Chen et al.

(10) Patent No.: US 9,793,280 B2
(45) Date of Patent: Oct. 17, 2017

(54) INTEGRATION OF SPLIT GATE FLASH MEMORY ARRAY AND LOGIC DEVICES

(71) Applicant: Silicon Storage Technology, Inc., San Jose, CA (US)

(72) Inventors: Chun-Ming Chen, New Taipei (TW); Jeng-Wei Yang, Zhubei (TW); Chien-Sheng Su, Saratoga, CA (US); Man-Tang Wu, Hsinchu County (TW); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 15/057,590

(22) Filed: Mar. 1, 2016

(65) Prior Publication Data

US 2016/0260728 A1    Sep. 8, 2016

Related U.S. Application Data

(60) Provisional application No. 62/128,322, filed on Mar. 4, 2015.

(51) Int. Cl.
*H01L 29/66* (2006.01)
*H01L 27/11531* (2017.01)
(Continued)

(52) U.S. Cl.
CPC .. *H01L 27/11531* (2013.01); *H01L 21/28273* (2013.01); *H01L 27/11534* (2013.01);
(Continued)

(58) Field of Classification Search
USPC ............... 257/68–71, 296–309, 905–908, 257/E27.084–E27.097, E27.075, 257/E21.646–E21.66, 225–234, 390, 257/E27.076, E21.662, E21.666–E21.678, 257/316–326, E27.078, E29.3–E29.309, 257/255–266, E21.179–E21.182,
(Continued)

(56) References Cited

U.S. PATENT DOCUMENTS

| 5,029,130 A | 7/1991 | Yeh |
| 6,747,310 B2 | 6/2004 | Fan et al. |

(Continued)

FOREIGN PATENT DOCUMENTS

CN    100490158    5/2009

*Primary Examiner* — Tram H Nguyen
(74) *Attorney, Agent, or Firm* — DLA Piper LLP (US)

(57) ABSTRACT

A memory device and method including a semiconductor substrate with memory and logic device areas. A plurality of memory cells are formed in the memory area, each including first source and drain regions with a first channel region therebetween, a floating gate disposed over a first portion of the first channel region, a control gate disposed over the floating gate, a select gate disposed over a second portion of the first channel region, and an erase gate disposed over the source region. A plurality of logic devices formed in the logic device area, each including second source and drain regions with a second channel region therebetween, and a logic gate disposed over the second channel region. The substrate upper surface is recessed lower in the memory area than in the logic device area, so that the taller memory cells have an upper height similar to that of the logic devices.

18 Claims, 17 Drawing Sheets

(51) Int. Cl.
*H01L 29/423* (2006.01)
*H01L 21/28* (2006.01)
*H01L 27/11534* (2017.01)
*G11C 16/04* (2006.01)

(52) U.S. Cl.
CPC .. *H01L 29/42328* (2013.01); *H01L 29/66825* (2013.01); *G11C 16/0425* (2013.01)

(58) Field of Classification Search
USPC ..... 257/E21.209–E21.21, E21.422, E21.423, 257/E21.679–E21.694, E27.098–E27.101, 257/E27.077, E21.661; 365/185.17, 365/185.29, 185.01

See application file for complete search history.

(56) References Cited

U.S. PATENT DOCUMENTS

| | | |
|---|---|---|
| 6,952,034 B2 | 10/2005 | Hu et al. |
| 7,315,056 B2 | 1/2008 | Klinger et al. |
| 7,868,375 B2 | 1/2011 | Liu et al. |
| 2003/0223296 A1 | 12/2003 | Hu et al. |
| 2004/0065917 A1 | 4/2004 | Fan et al. |
| 2005/0269622 A1 | 12/2005 | Klinger et al. |
| 2008/0012063 A1 | 1/2008 | Hong |
| 2010/0054043 A1 | 3/2010 | Liu et al. |
| 2013/0032872 A1 | 2/2013 | Kotov et al. |
| 2013/0082318 A1 | 4/2013 | Liu et al. |
| 2014/0264539 A1 | 9/2014 | Do et al. |
| 2015/0041875 A1* | 2/2015 | Perera ............... H01L 29/78 257/314 |
| 2015/0263010 A1* | 9/2015 | Chuang ............ H01L 27/11534 257/319 |
| 2016/0020219 A1* | 1/2016 | Chuang ............ H01L 27/11573 257/324 |
| 2016/0181266 A1* | 6/2016 | Chuang ............ H01L 27/11541 257/316 |

* cited by examiner

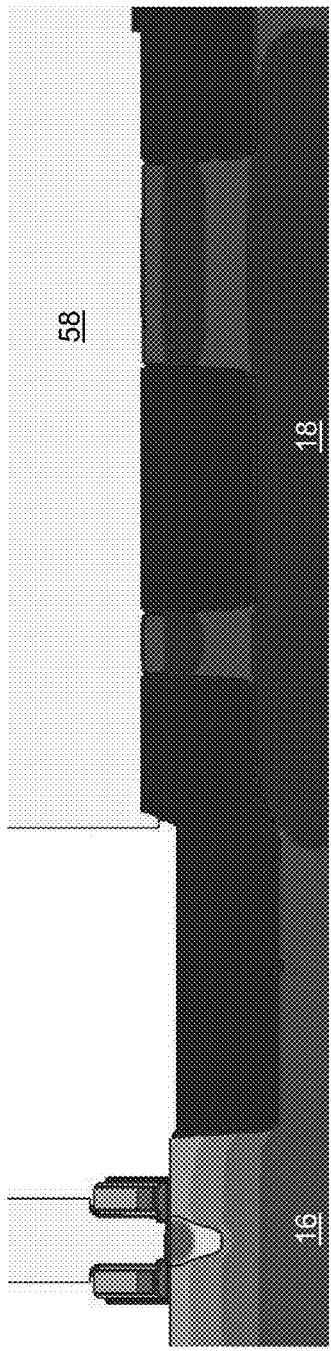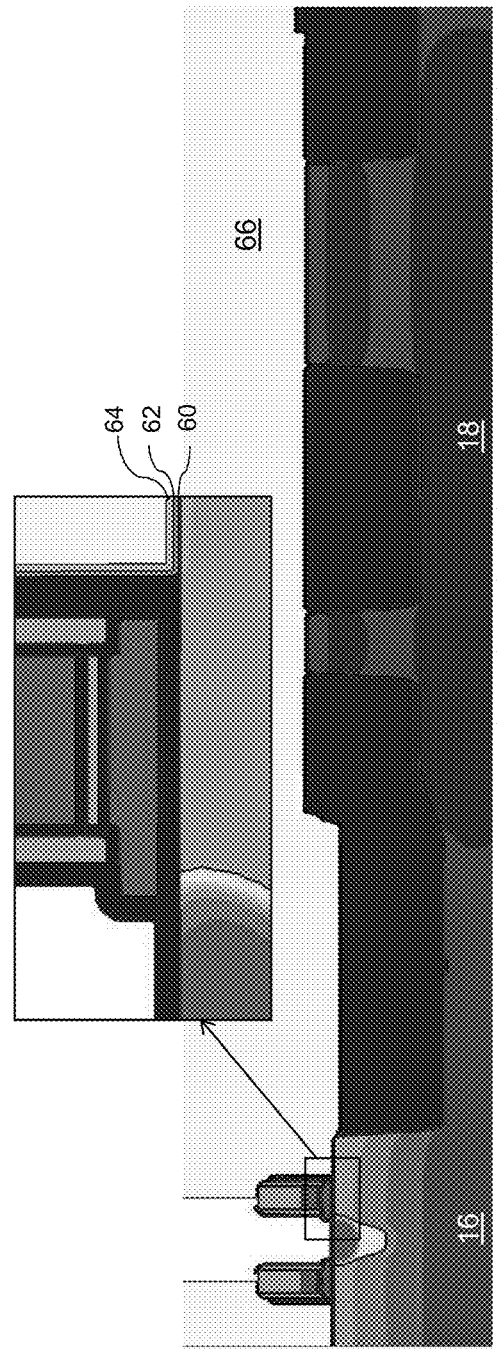

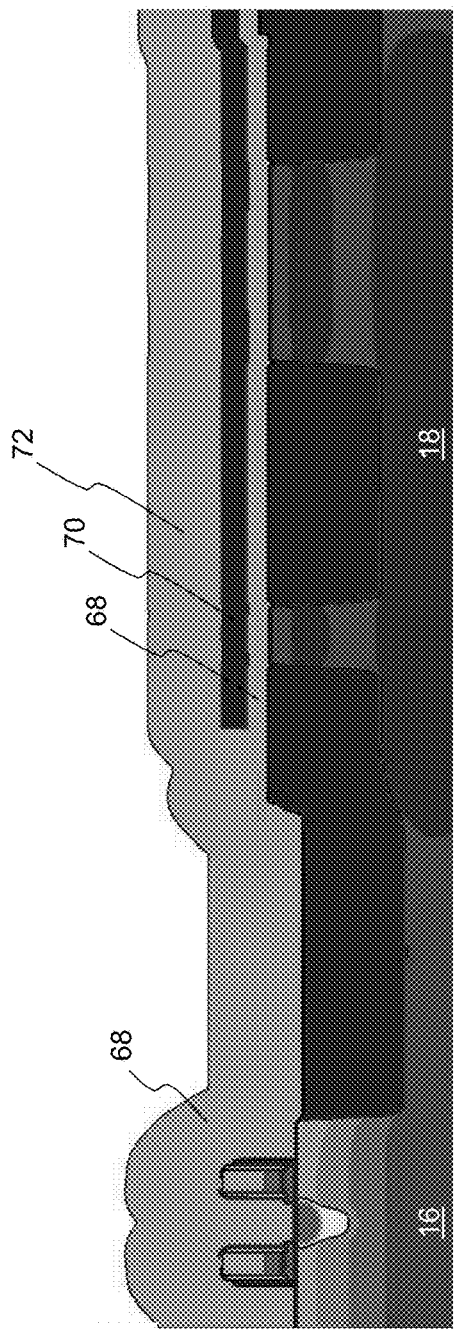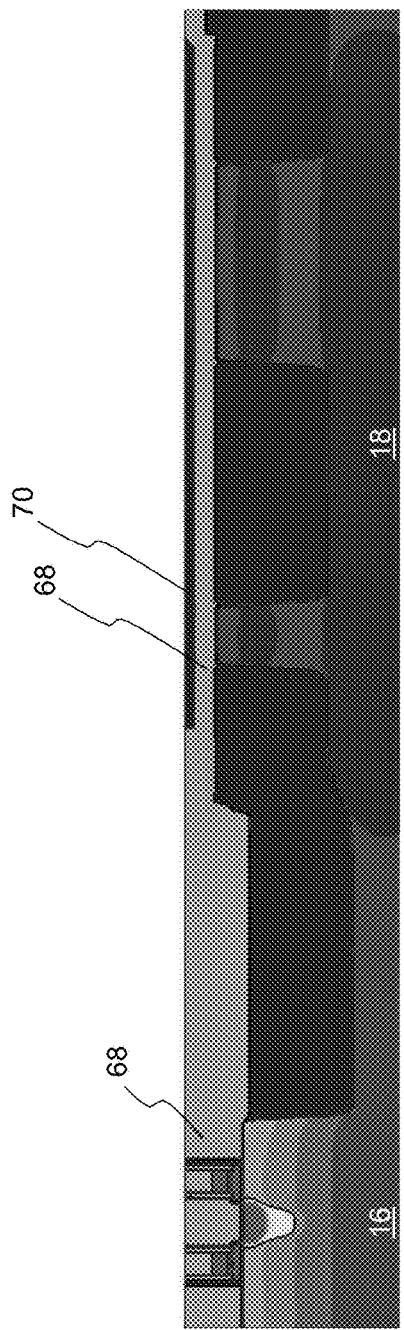

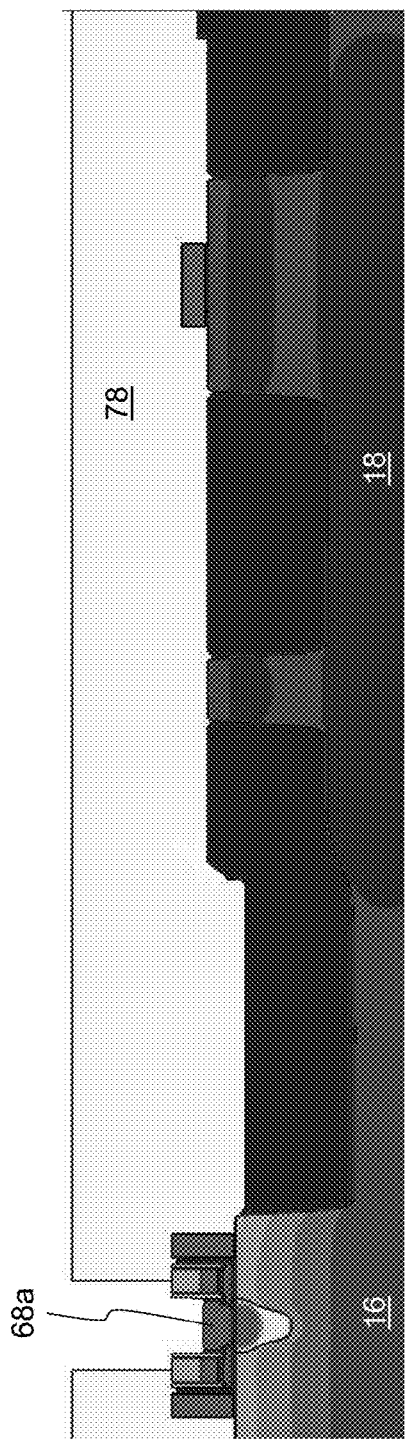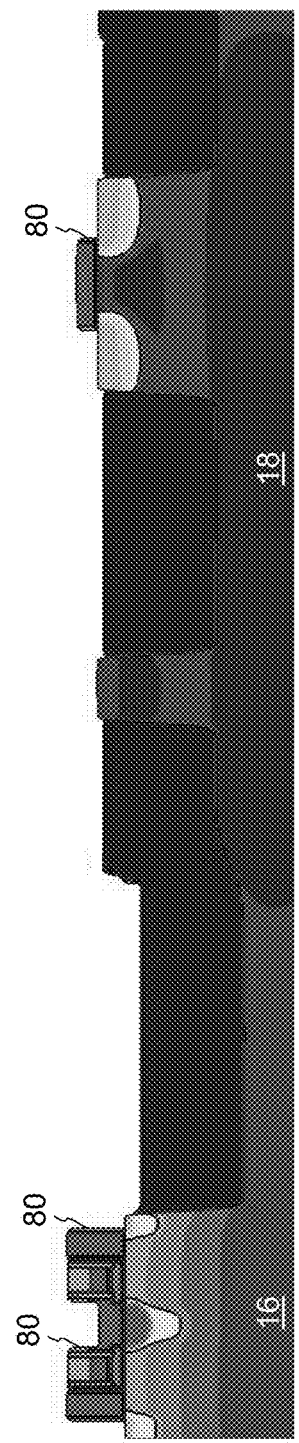
FIG 22
FIG 23

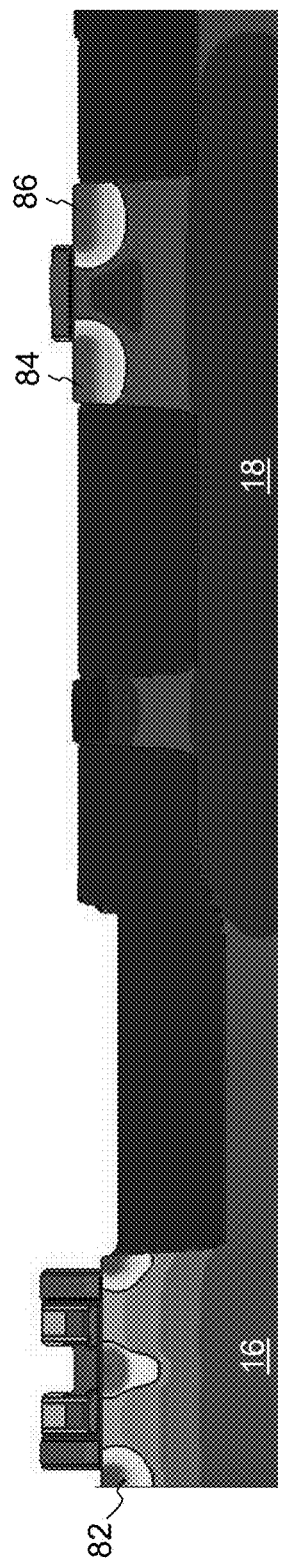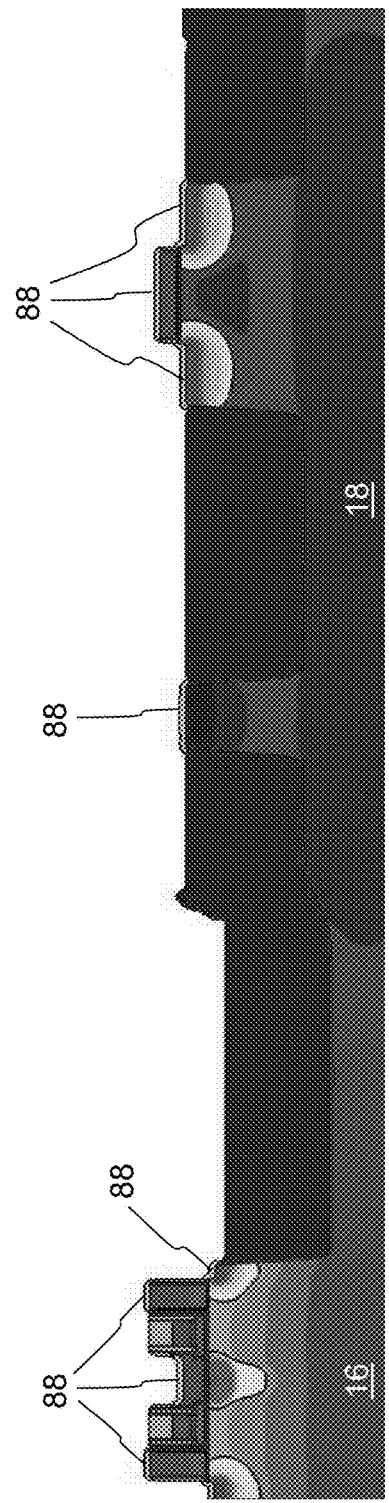

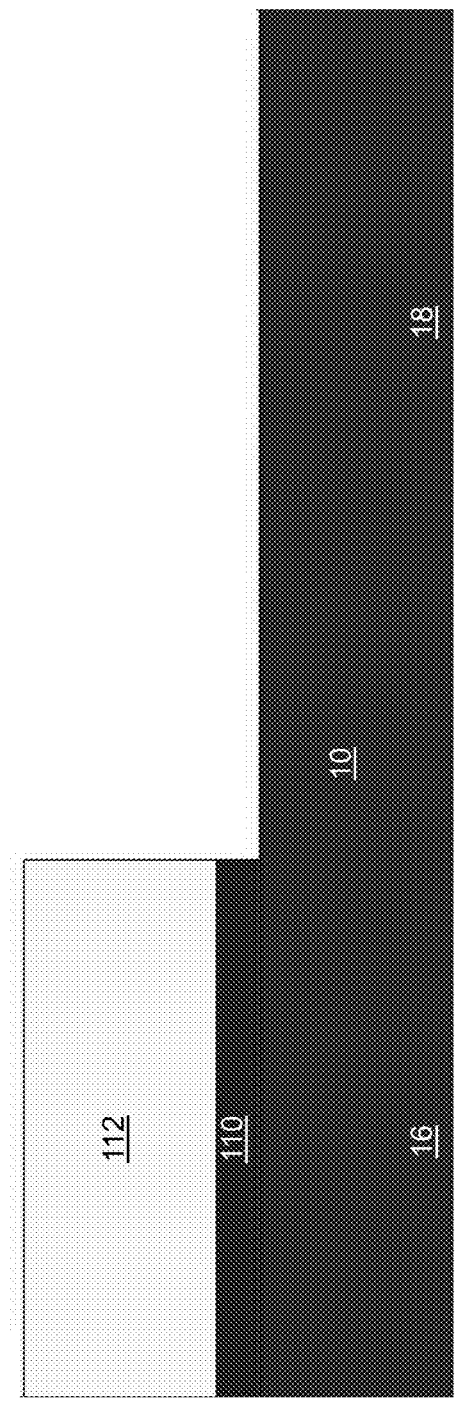
FIG 31
FIG 32

INTEGRATION OF SPLIT GATE FLASH MEMORY ARRAY AND LOGIC DEVICES

RELATED APPLICATIONS

This application claims the benefit of U.S. Provisional Application No. 62/128,322, filed Mar. 4, 2015, and which is incorporated herein by reference.

FIELD OF THE INVENTION

The present invention relates to flash memory cell arrays, and more particularly to the integration of a flash memory array on the same wafer as logic devices.

BACKGROUND OF THE INVENTION

It is known to form core logic devices such as high voltage, input/output and/or analog devices, on the same substrate as non-volatile memory devices (i.e. typically referred to as embedded memory devices). This is especially true for split gate non-volatile memory devices, where the memory cell architecture includes gates partially or fully stacked over other gates. However, as the device geometries of the logic devices continue to shrink, the height of the flash memory cells over the substrate surface is becoming much greater than that of the logic devices formed on the same substrate. Attempts to shrink the height of the memory cells over the substrate surface at the same rate as the logic devices can result in leakage or other detrimental effects.

BRIEF SUMMARY OF THE INVENTION

The aforementioned issues are addressed by a memory device having a semiconductor substrate having a memory area and a logic device area, wherein an upper surface of the substrate in the memory area is recessed lower than an upper surface of the substrate in the logic device area, a plurality of memory cells formed in the memory area of the substrate, and a plurality of logic devices formed in the logic device area of the substrate. Each of the memory cells includes a first source region formed in the substrate, a first drain region formed in the substrate, wherein a first channel region is defined in the substrate between the first source region and the first drain region, a floating gate disposed over and insulated from a first portion of the first channel region that is adjacent the source region, a control gate disposed over and insulated from the floating gate, a select gate disposed over and insulated from a second portion of the first channel region that is adjacent to the drain region, and an erase gate disposed over and insulated from the source region. Each of the logic devices includes a second source region formed in the substrate, a second drain region formed in the substrate, wherein a second channel region is defined in the substrate between the second source region and the second drain region, and a logic gate disposed over and insulated from the second channel region.

A method of forming a memory device includes forming one or more protective layers on a surface of a semiconductor substrate having a memory area and a logic device area, removing the one or more protective layers from the memory device area of the substrate while preserving the one or more protective layers in the logic device area of the substrate, performing an oxidation process that forms an oxide layer on the substrate surface in the memory area, wherein the oxidation process consumes and lowers a height of the substrate surface in the memory area such that the surface of the substrate in the memory area is recessed lower than the surface of the substrate in the logic device area, removing the one or more protective layers from the logic device area of the substrate, removing the oxide layer from the memory area of the substrate, forming a plurality of memory cells in the memory area of the substrate, and forming a plurality of logic devices in the logic device area of the substrate. Each of the memory cells includes a first source region formed in the substrate, a first drain region formed in the substrate, wherein a first channel region is defined in the substrate between the first source region and the first drain region, a floating gate disposed over and insulated from a first portion of the first channel region that is adjacent the source region, a control gate disposed over and insulated from the floating gate, a select gate disposed over and insulated from a second portion of the first channel region that is adjacent to the drain region, and an erase gate disposed over and insulated from the source region. Each of the logic devices includes a second source region formed in the substrate, a second drain region formed in the substrate, wherein a second channel region is defined in the substrate between the second source region and the second drain region, and a logic gate disposed over and insulated from the second channel region.

A method of forming a memory device includes forming one or more protective layers on a surface of a semiconductor substrate having a memory area and a logic device area, removing the one or more protective layers from the logic device area of the substrate while preserving the one or more protective layers in the memory area of the substrate, performing an epitaxial growth process that grows silicon on the substrate surface in the logic area, wherein the epitaxial growth process raises a height of the substrate surface in the logic device area such that the surface of the substrate in the logic device area is raised higher than the surface of the substrate in the memory area, removing the one or more protective layers from the memory area of the substrate, forming a plurality of memory cells in the memory area of the substrate, and forming a plurality of logic devices in the logic device area of the substrate. Each of the memory cells includes a first source region formed in the substrate, a first drain region formed in the substrate, wherein a first channel region is defined in the substrate between the first source region and the first drain region, a floating gate disposed over and insulated from a first portion of the first channel region that is adjacent the source region, a control gate disposed over and insulated from the floating gate, a select gate disposed over and insulated from a second portion of the first channel region that is adjacent to the drain region, and an erase gate disposed over and insulated from the source region. Each of the logic devices includes a second source region formed in the substrate, a second drain region formed in the substrate, wherein a second channel region is defined in the substrate between the second source region and the second drain region, and a logic gate disposed over and insulated from the second channel region.

Other objects and features of the present invention will become apparent by a review of the specification, claims and appended figures.

BRIEF DESCRIPTION OF THE DRAWINGS

FIGS. 1-30 are side cross sectional views showing the steps in forming the memory device of the present invention.

FIGS. 31-32 are side cross sectional views showing an alternate embodiment in the steps in forming the memory device of the present invention.

DETAILED DESCRIPTION OF THE INVENTION

The present invention is a technique of forming memory cells and logic devices on the same substrate such that the top height of the memory cells is comparable to that of the logic devices.

Figure 1:
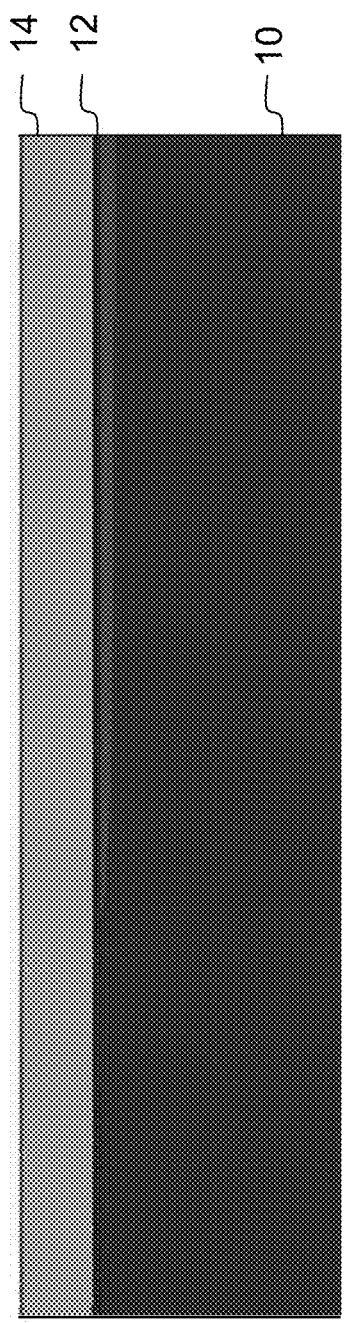
Figure 2:
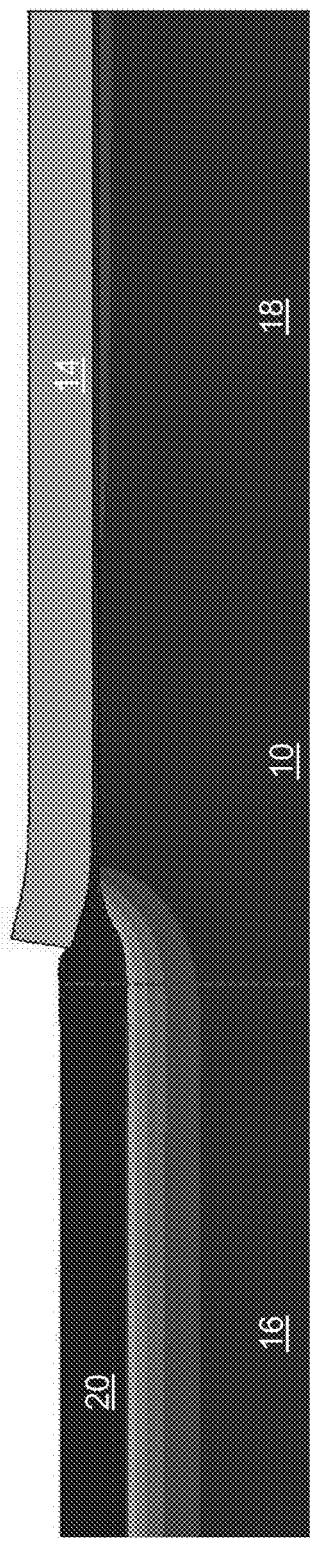
Figure 3:

FIGS. 1-30 show the process of forming the memory cells and logic devices on the same substrate. The process begins by forming a layer of silicon dioxide (oxide) 12 on a silicon substrate 10. A layer of nitride 14 is formed on the oxide layer 12, as shown in FIG. 1. A photolithography and nitride etch process is performed to selectively remove the nitride layer 14 in the memory cell area (MCEL area) 16 of the substrate while maintaining the nitride layer 14 in the logic device area (periphery area) 18 of the substrate. LOCOS oxidation then performed to create a thick layer of oxide 20 in the MCEL area 16, as shown in FIG. 2. This oxidation consumes the exposed portion of the substrate, thus reducing the height of the upper surface of the substrate in the MCEL area 16 relative to that of the periphery area 18. A nitride etch is performed to remove the nitride layer 14, followed by an oxide etch to remove the oxide 20. The resulting structure is shown in FIG. 3, where the substrate upper surface in the MCEL area 16 is recessed (e.g. by a depth D—such as 700 Å) relative to the substrate upper surface in the periphery area 18.

Figure 4:
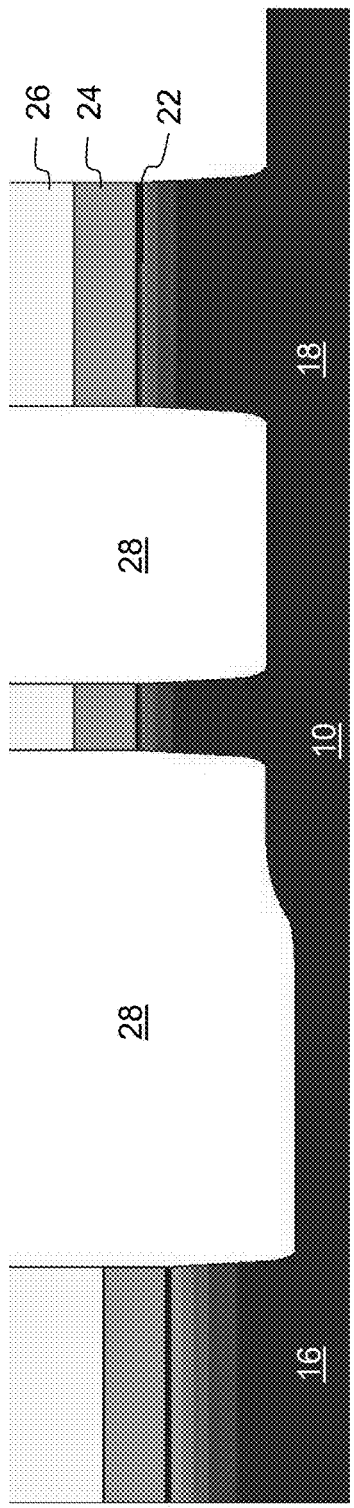
Figure 5:
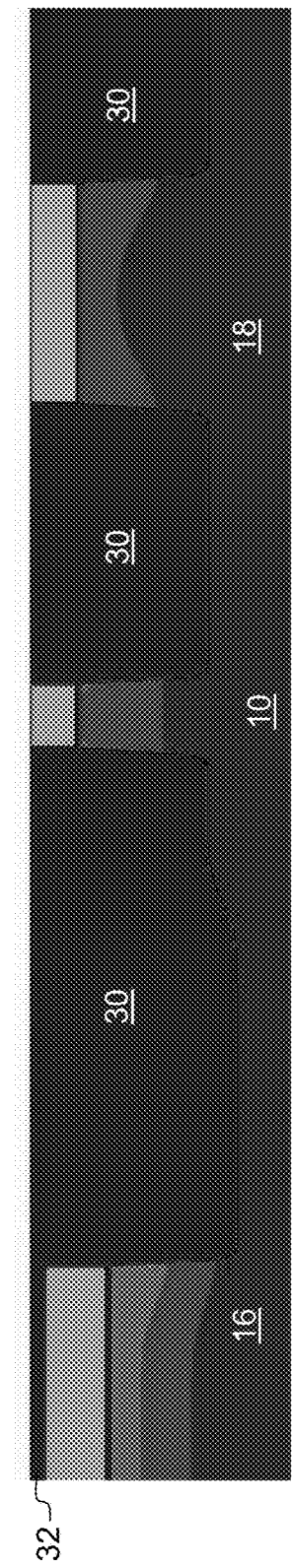

An oxide formation process is performed to form an oxide layer 22 (Pad Oxide) on the substrate. A nitride layer 24 is then formed on the pad oxide layer 22. Photo resist 26 is then formed over the structure and selectively exposed and etched using photolithography to leave selected portions of the nitride layer 24 exposed. Nitride, oxide and silicon etches are performed to form trenches 28 through the nitride and oxide layers, and into the substrate, as shown in FIG. 4. An oxide deposition, followed by an oxide chemical mechanical polish (CMP) etch, are performed to fill the trenches with STI oxide 30. By using the pad nitride in the periphery area as the CMP etch stop, a layer of oxide 32 is left on the nitride layer in the MCEL area, as shown in FIG. 5 (after removal of the photoresist).

Figure 6:
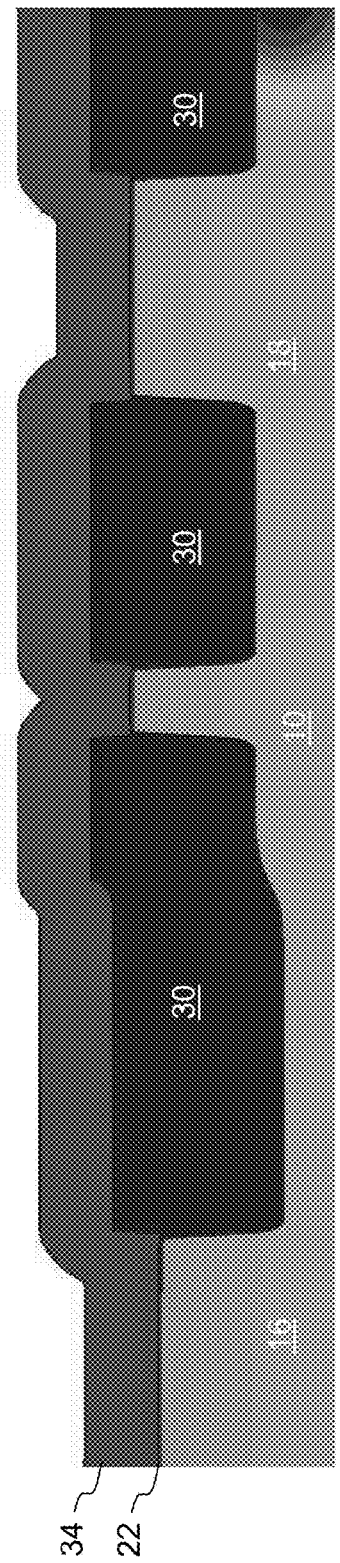
Figure 7:
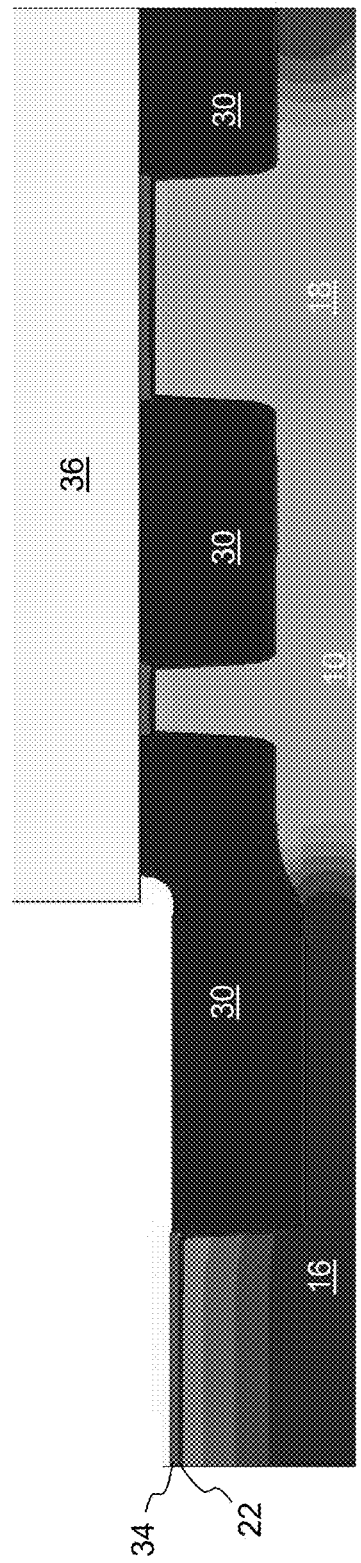

Photo resist is formed over the structure and removed from the MCEL area 16. An oxide etch is used to remove oxide 32 (and lower the upper surface of the portion of the STI oxide 30 in the MCEL area 16). After the photo resist is removed, a nitride etch is used to remove the nitride layer 24. A polysilicon layer 34 is deposited over the structure, followed by an implant into this poly layer (referred to as a FG poly layer because it is this polysilicon that will eventually form the floating gates of the memory cells), as shown in FIG. 6. A polysilicon CMP etch is next performed, which leaves selective portions of the polysilicon 34 in the MCEL and periphery areas. A poly etch is performed to remove the poly layer 34 over the STI oxide 30, but leaving a thin layer over the pad oxide layer 22 in the MCEL and periphery areas. Photoresist 36 is deposited over the structure, and selectively removed to expose the MCEL area 16 using a photolithography process. An oxide etch is used to lower (etch back) the STI oxide 30. The resulting structure is shown in FIG. 7.

Figure 8:
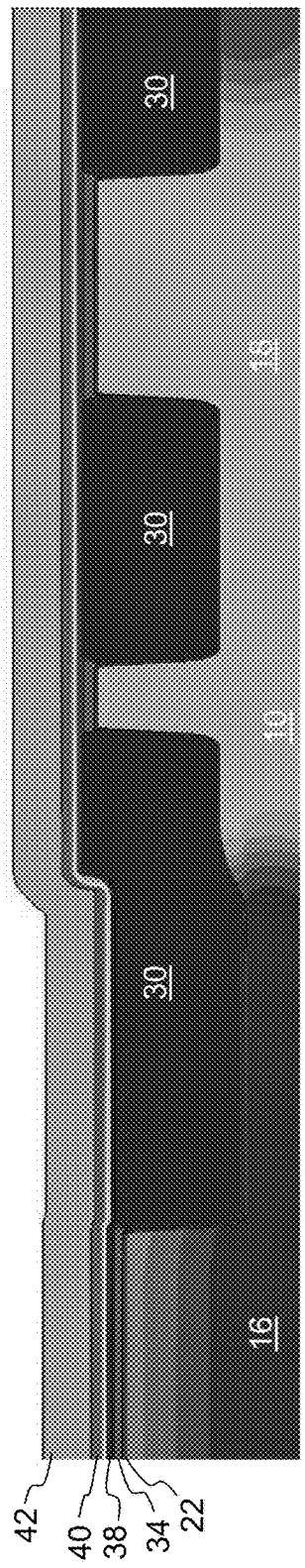
Figure 9:
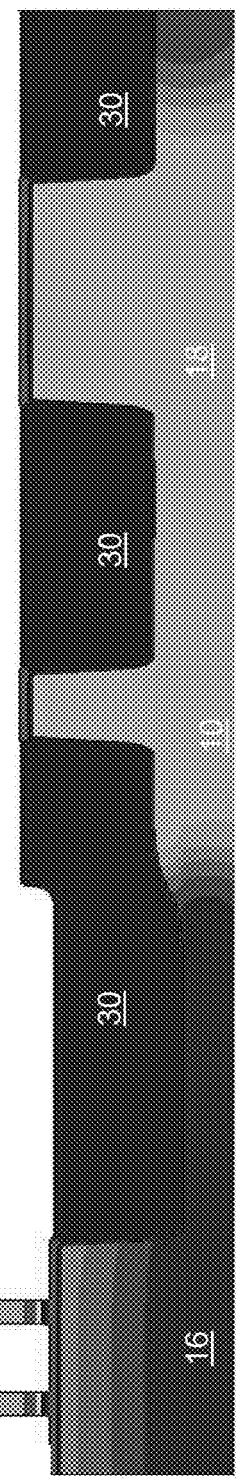

After the photoresist 36 is removed, an ONO layer 38 (i.e., oxide, nitride, oxide sub-layers) is formed over the structure, followed by the formation of a poly layer 40 over the ONO layer 38, and the formation of a nitride layer 42 over the poly layer 40, as shown in FIG. 8. The structure is covered with photoresist, which is selectively removed to expose the nitride layer 42 except for selected portions in the MCEL region 16. Nitride, poly, oxide, nitride and oxide etches are performed to remove the nitride, poly and ONO layers from the structure except for those portions protected by the photo resist, leaving pairs of stacks S1 and S2 of such layers in the MCEL area 16. The resulting structure is shown in FIG. 9 (after removal of the photo resist). The area between stacks S1 and S2 is referred to as the SL (source line) side, and the areas outside of stacks S1 and S2 are referred to as the WL (word line) sides. While only one pair of stacks S1 and S2 are shown, there is an array of such stack pairs in the MCEL area 16.

Figure 10:
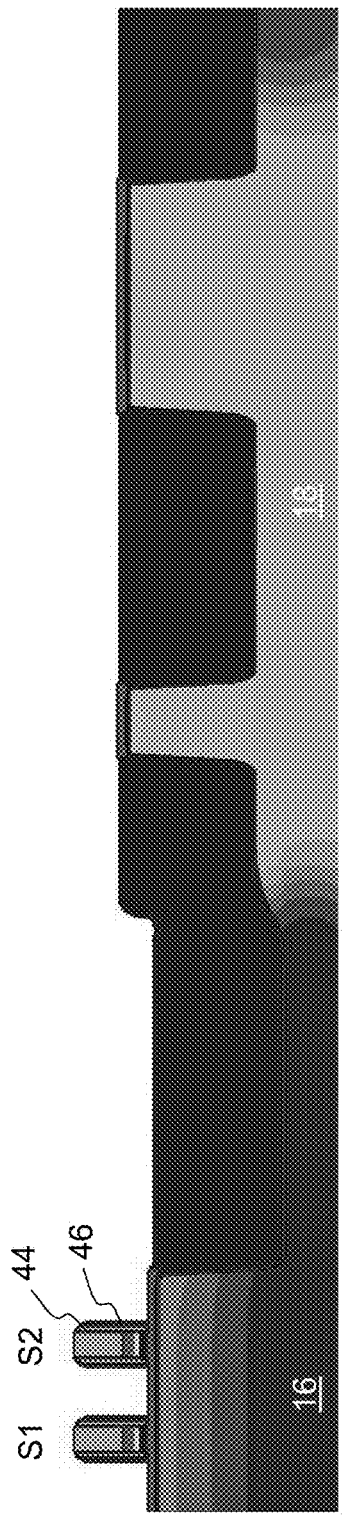

Spacers are then formed along the sidewalls of the stacks S1 and S2. Formation of spacers are well known in the art, and involve depositing a layer of material over the structure, followed by an anisotropic etch to remove the material from the horizontal portions of the structure, but leaving the material intact (with a curved upper surface) along vertical surfaces of the structure. The spacers along stacks S1 and S2 are formed by depositing a layer of oxide and a layer of nitride, followed by an anisotropic nitride etch, leaving nitride spacers 44. Additional sacrificial oxide spacers (SAC spacers) 46 are formed along the nitride spacers 44 by oxide deposition and etch. The resulting structure is shown in FIG. 10.

Figure 11:
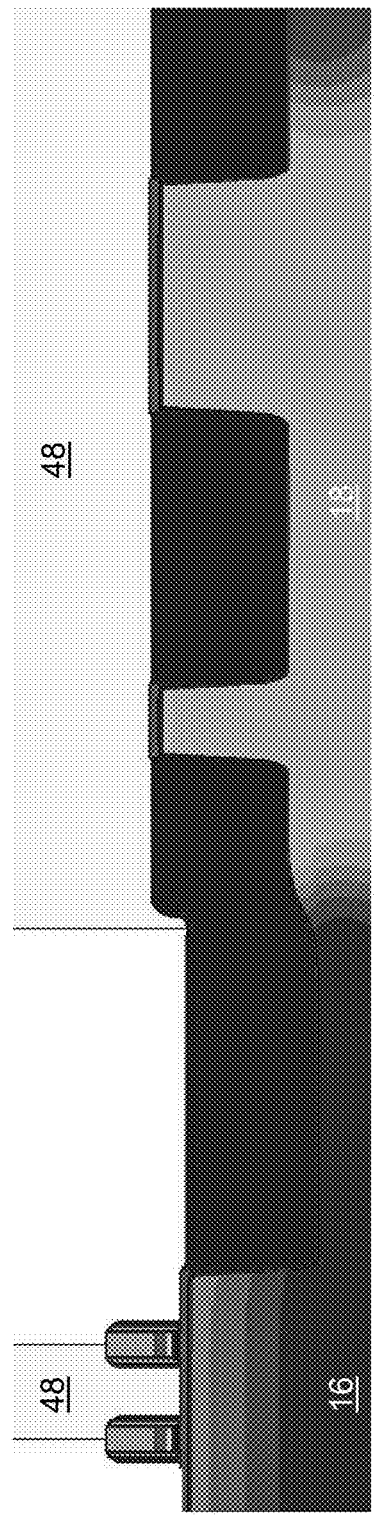
Figure 12:
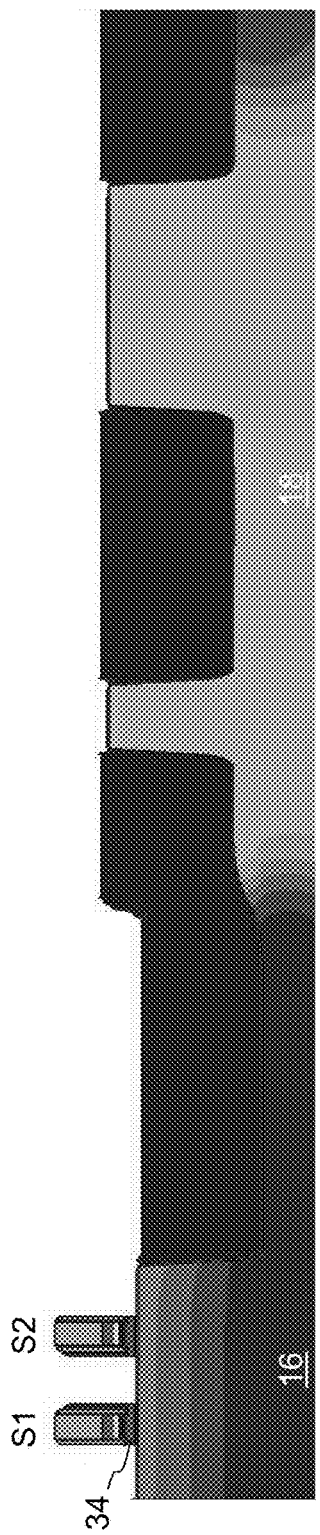

Photo resist is formed over the structure, and selectively exposed and etched away using a photolithography process, leaving photoresist 48 over the periphery area and the SL side of the stacks S1 and S2 in the MCEL area, as shown in FIG. 11. A Vt implant is then performed on the exposed WL sides of stacks S1 and S2. An oxide etch is then performed to remove the sacrificial oxide spacers 46 from the WL sides of stacks S1 and S2. After the photo resist is removed, a poly etch is used to remove the exposed portions of the poly layer 34 (leaving the poly layer 34—FG poly—only as part of stacks S1 and S2). The resulting structure is shown in FIG. 12.

Figure 13:
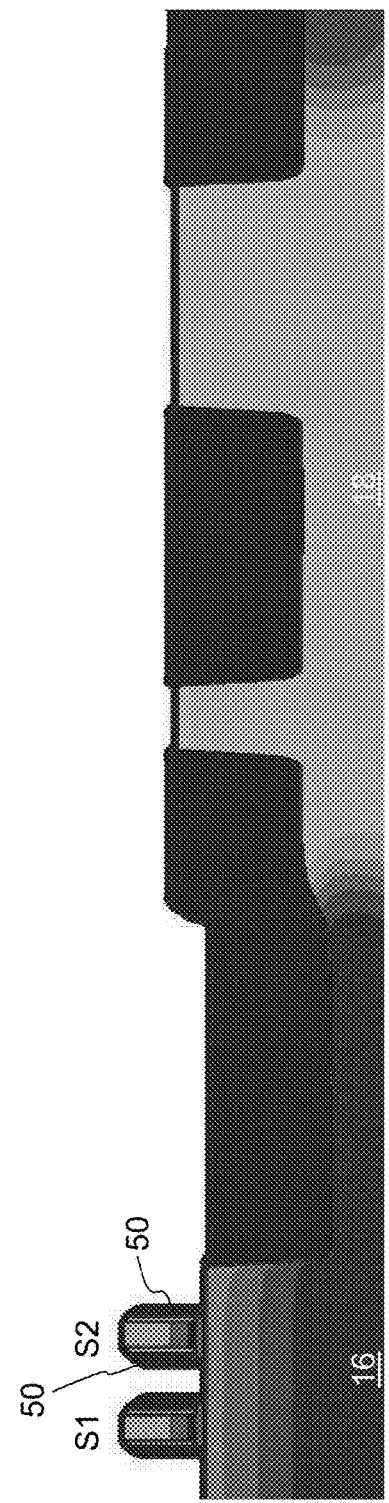
Figure 14:
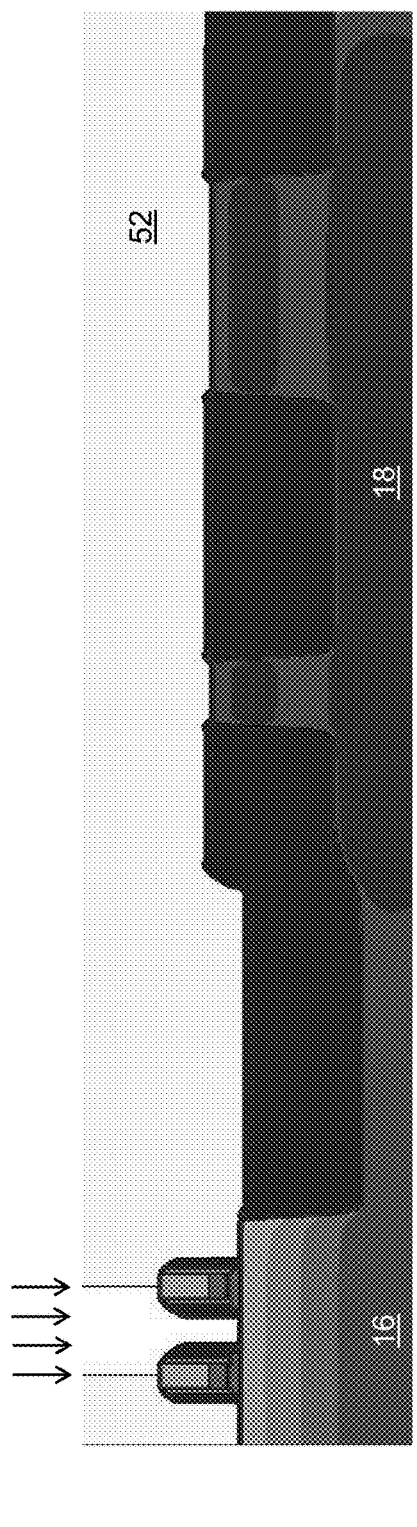
Figure 15:
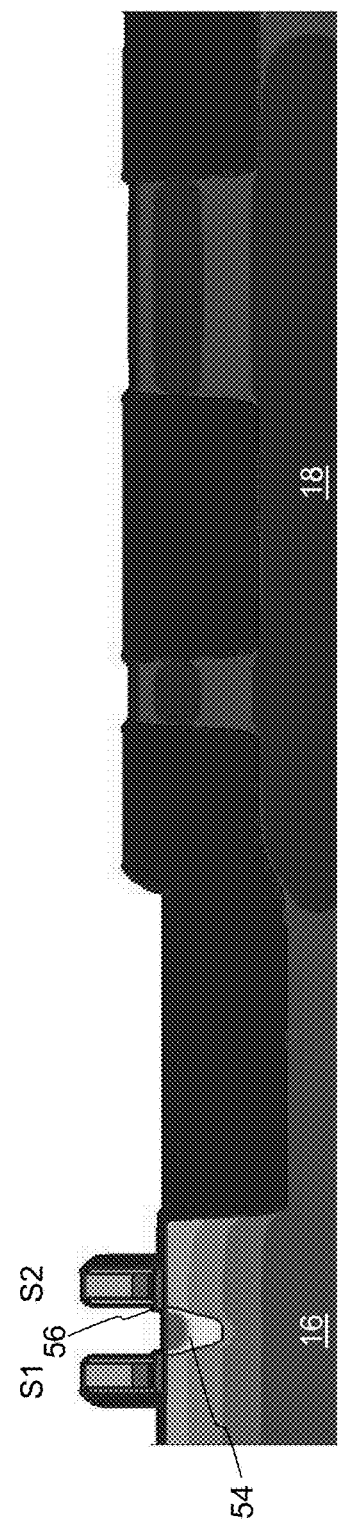

Oxide spacers 50 are then formed along the sidewalls of stacks S1 and S2 by oxide formation and etch as shown in FIG. 13. Photo resist 52 is then formed over the structure and removed by photolithography exposure on the SL side of stacks S1 and S2, as shown in FIG. 14. A high voltage implant and anneal are then performed to form a source region 54 in the substrate between stacks S1 and S2. An oxide etch is used to remove the oxide 22 on the SL side of stacks S1 and S2. An oxide deposition is then used to form a thin layer of oxide 56 (suitable for tunneling) over the exposed portions of the substrate and poly layer 34 (and along the sides of the nitride spacers). The resulting structure is shown in FIG. 15 (after removal of the photo resist).

Photo resist is formed over the structure, and selectively exposed and etched away using a photolithography process, leaving photoresist 58 over the periphery area and the SL side of the stacks S1 and S2 in the MCEL area. An oxide etch is then performed to remove the exposed portions of oxide (including thinning the oxide spacers 50), as shown in FIG. 16. After the photoresist material 58 is removed, an insulation layer is formed over the structure. Preferably, the insulation layer includes a first layer of thin oxide 60 as the interfacial layer and a second layer 62 of a high K material (i.e. having a dielectric constant K greater than that of oxide, such as HfO2, ZrO2, TiO2, Ta2O5, or other adequate materials, etc.). The oxide layer 60 thickness may be varied to achieve different threshold voltages for the select gate of the split-gate flash cell. An optional thermal treatment may follow to enhance moisture control on the gate dielectric. A capping layer 64, such as TiN, TaN, TiSiN, may be deposited on the structure to protect the high K material 62 from damage in the subsequent processing steps. The capping layer 64, high K material layer 62 and oxide layer 60 can be removed from the SL side of stacks S1 and S2 using photolithography etching (form photo resist 66 that is removed from the SL side of stacks S1 and S2, followed by etch, however this is optional). The resulting structure is shown in FIG. 17.

Figure 20:
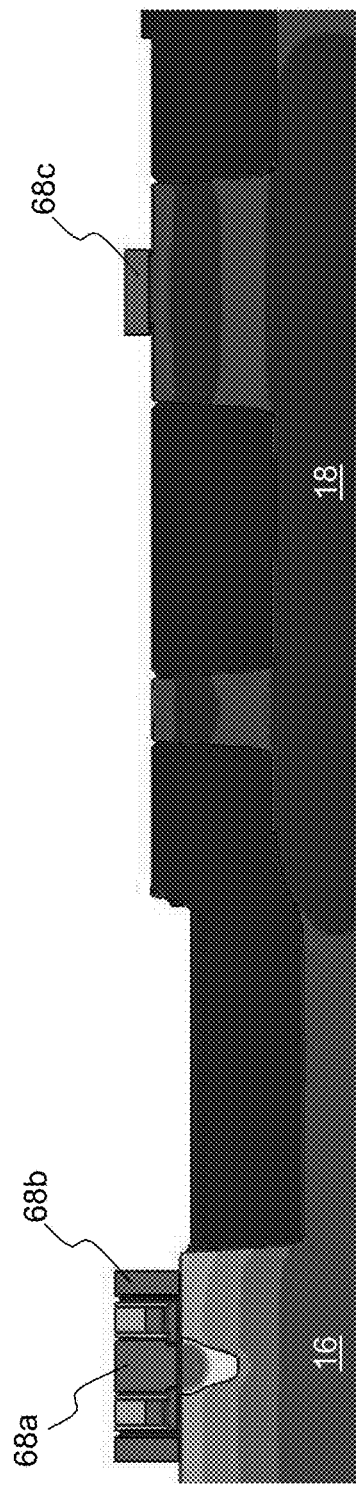

A layer of polysilicon 68 is deposited on the structure, following by the deposition of a cap oxide layer 70 on the polysilicon 68. The cap oxide layer 70 is then removed from the MCEL area by a photolithographic etch. Additional polysilicon is deposited on the poly layer in the MCEL area (thickening poly 68) and on the cap oxide layer in the periphery area as poly layer 72. The resulting structure is shown in FIG. 18. A poly CMP etch is performed, using the cap oxide 70 as an etch stop, to remove polysilicon layer 72 above the cap oxide 70, as shown in FIG. 19. An oxide etch is used to remove the cap oxide 70. Then, the poly layer 68 is patterned using photolithography, leaving a block of polysilicon between stacks S1 and S2 (EG poly 68a), blocks of polysilicon on either side of the stacks S1 and S2 (WL poly 68b), and a block of polysilicon 68c in the periphery area (logic poly). The resulting structure is shown in FIG. 20 (after the photolithography resist is removed).

Figure 21:
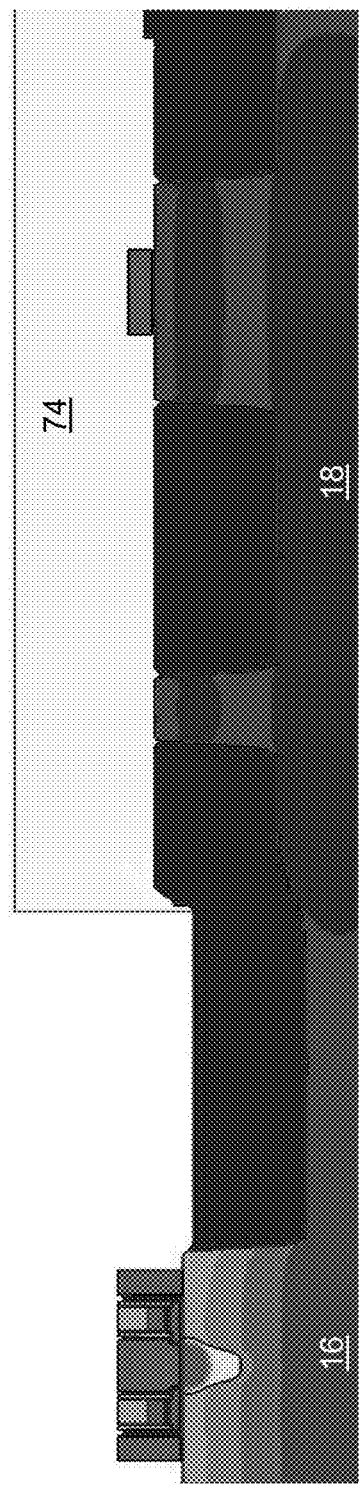

An optional N+ poly pre-implant may be performed. This is followed by a photoresist coating, mask exposure and selective removal, to leave the periphery area covered by photo resist 74 and the MCEL area exposed by the photoresist, as shown in FIG. 21. Cell Halo and LDD implant are performed in the exposed portions of substrate 10 adjacent the WL poly blocks 68b. The relatively thick EG poly 68a protects the tunnel oxide 56 from being damaged by the Cell Halo and LDD implant. The photoresist 74 is removed, and new photoresist 78 is formed, and selectively etched to expose the area between the stacks S1 and S2. A poly etch is then used to reduce the height of EG poly block 68a, as shown in FIG. 22.

After the photoresist 78 is removed, oxide and nitride depositions and etches are performed to form insulation spacers 80 of oxide and nitride alongside the WL poly blocks 68b and the logic poly blocks 68c. An LDD implant can be applied to the exposed portions of substrate adjacent the logic poly blocks 68c and memory cell stacks S1/S2, as shown in FIG. 23. Photoresist is formed and patterned to cover exposed areas of the substrate not adjacent the memory cell stacks S1/S2 and the logic poly blocks. Then, an N+ implant and anneal is performed to form drain regions 82 in the substrate adjacent the WL poly blocks 68b in the MCEL area, and source/drain regions 84/86 in the substrate adjacent the logic poly block 68c in the periphery region, as shown in FIG. 24 (after photoresist removal).

Figure 26:
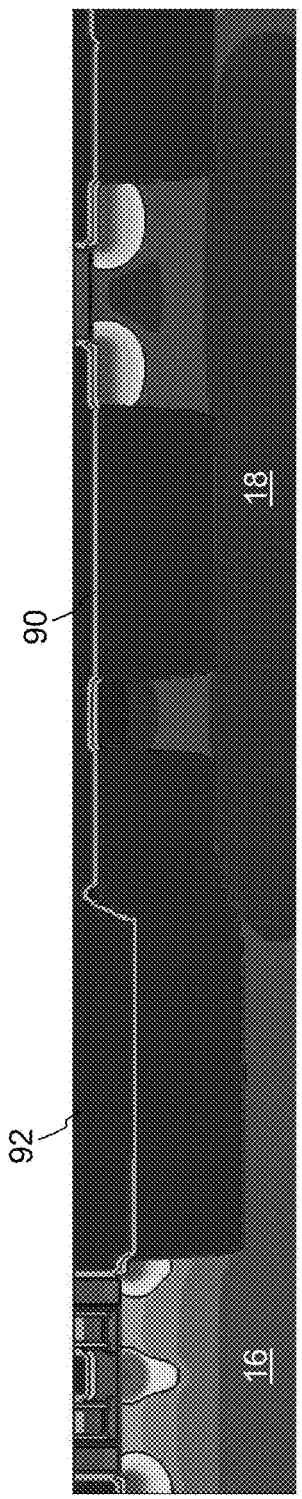

A metallization process is performed to form silicide 88 on the exposed portions the substrate and the poly blocks, as shown in FIG. 25. A layer of nitride 90 is formed over the structure, followed by an inter-layer dielectric (ILD) material 92. A CMP etch is then performed to remove the portions of the nitride 90 and ILD 92 above the WL poly blocks 68b (which also removes the silicide 88 on those poly blocks), and reduce the height of the stacks S1 and S2 and poly blocks 68b so that they are even with the logic poly block 68c in the periphery area, as shown in FIG. 26.

Figure 27:
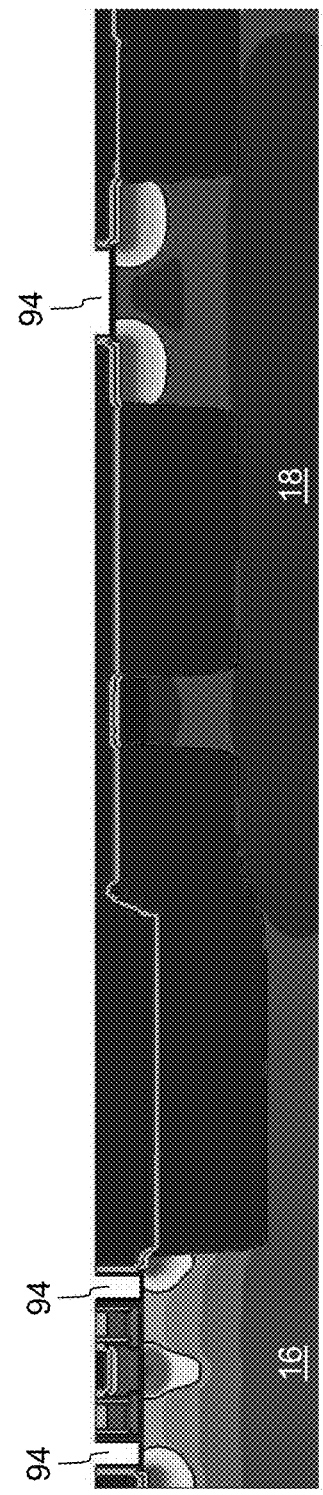
Figure 28:
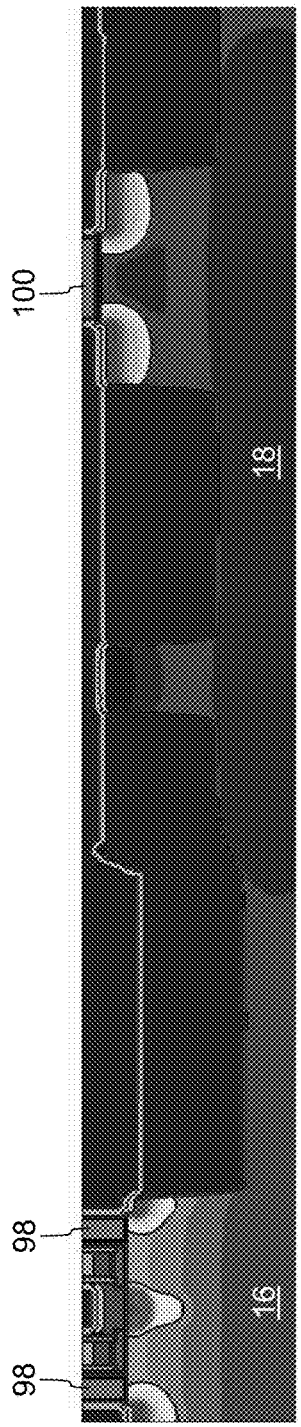

A poly etch is then performed to remove the WL poly blocks 68b and the logic poly blocks 68c, leaving open trenches 94 behind, as shown in FIG. 27. A layer of work function metal gate material 96, such as TiAlN1-x, is deposited on the structure. Its work function can be further tuned by changing oxygen vacancies or nitrogen concentration. The gate threshold voltages can be adjusted through the tuning of the work function. A thick layer of metal (e.g. aluminum, Ti, TiAlN, TaSiN, etc.) is deposited on the structure, followed by a CMP etch back, leaving metal blocks 98 filling the trenches that are partially over the drain regions 82 in the MCEL area, and metal blocks 100 filling the trenches the area between the source/drain regions in the periphery area. A post-metal thermal treatment may be applied to optimize the performance of the memory cells and/or logic devices. The resultant structure is shown in FIG. 28.

Figure 29:
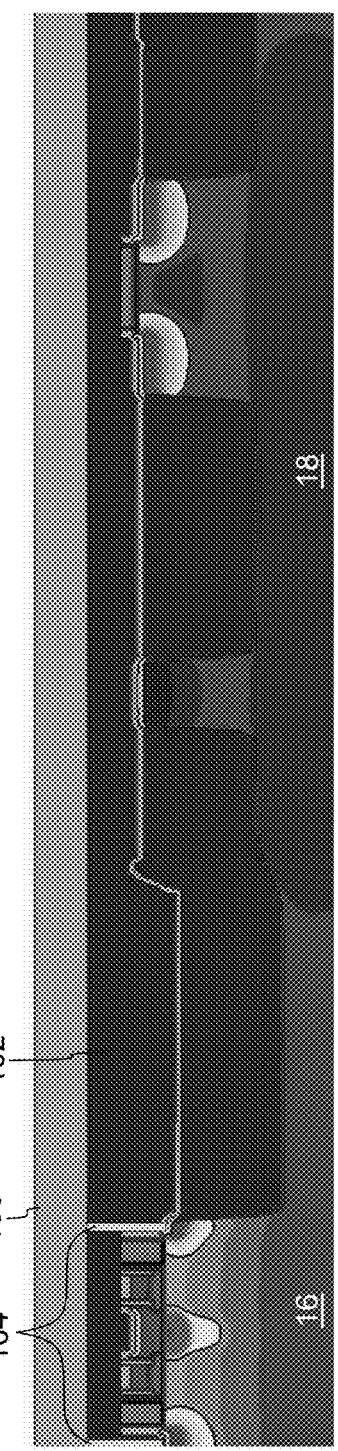

An insulation layer (e.g. ILD) 102 is formed over the structure, and planarized using a CMP etch. Contact openings are formed through the ILD layer down to and exposing the silicide over the drain regions 82 in the MCEL area using an appropriate photo resist coating, mask exposure, selective photo resist etch and ILD etch. The contact openings are filled with conductive material (e.g. tungsten) using an appropriate deposition and CMP etch to form electrical contacts 104. A metal contact line (e.g. copper) 106 is then formed over ILD layer 102 and in contact with the electrical contacts 104, as shown in FIG. 29.

Figure 30:
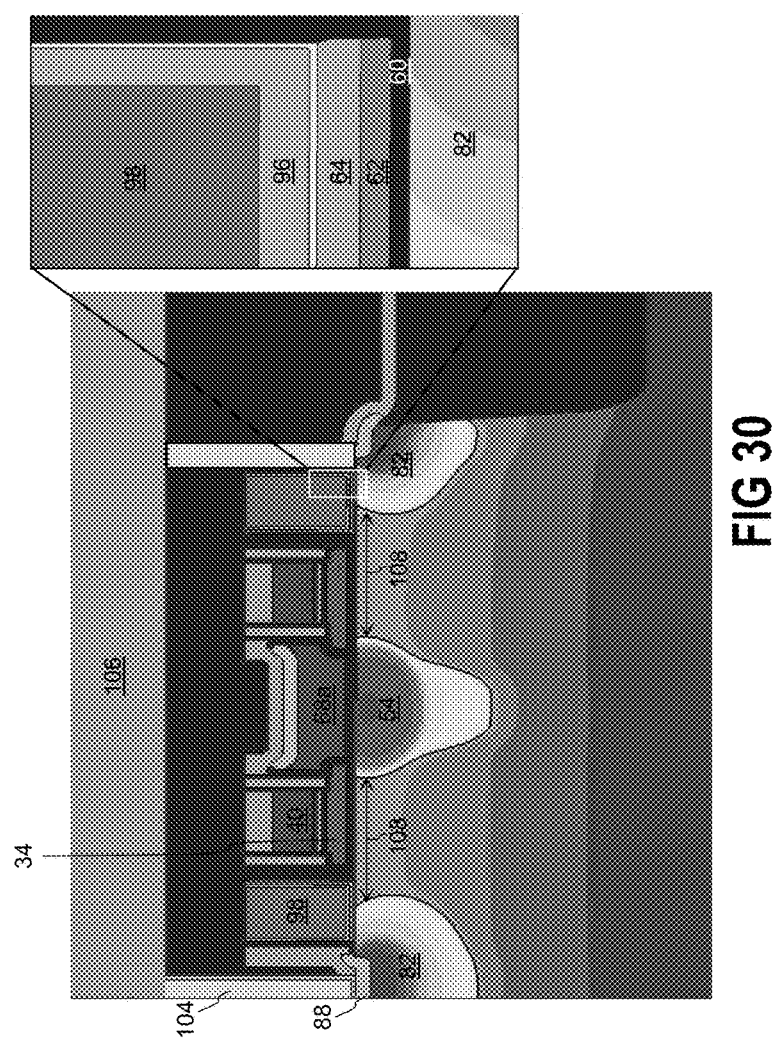

As shown in FIG. 30, the memory cells are formed in pairs that share a common source region 54 and common erase gate 68a. Each memory cell includes a channel region 108 extending between the source and drain regions 54/82, and have a first portion disposed under the floating gate 34 and a second portion disposed under the select gate 98 (also referred to as the word line gate WL). The control gate 40 is disposed over the floating gate 34. By having the select gates 98 being formed of metal, and silicide 88 connecting contacts 104 with the drain regions 82, along with the insulation layer underneath the select gates 98 formed of oxide 60 and a high K film 62, the speed and performance of the memory cell is enhanced over memory cells with conventional polysilicon gates and conventional oxide as the gate dielectric under the select gates. Moreover, because the memory cell pair is formed on a portion of the substrate surface that is recessed compared to that of the periphery area containing the logic devices, while the bottoms of each are not aligned to each other (i.e. the bottoms of the memory cells are lower than that of the logic devices), the tops of each are roughly even in height relative to the substrate, making for better integration of memory cells and logic devices on the same chip. It should be noted that while only one pair of memory cells and one logic device are shown and described above, one skilled in the art would understand that an array of such memory cell pairs, and a plurality of such logic devices, would be formed simultaneously.

FIGS. 31-32 illustrate an alternate embodiment in forming the stepped upper surface of the substrate to compensate for the memory cells being taller than the logic devices. Specifically, instead of etching the upper surface of the substrate in the MCEL area in order to recess it, the height of the silicon substrate can be raised in the periphery area by epitaxial growth to effectively achieve the same result. This is accomplished by forming an oxide layer 110 over the structure and photo resist 112 on the oxide layer 110, and then patterning the photo resist 112 and oxide layer 110 so that only the periphery area 18 of the substrate is left exposed, as shown in FIG. 31. Then, silicon 114 is epitaxially grown on the exposed substrate surface in the periphery area 18, leaving that area of the substrate surface higher than the substrate surface in the MCEL area, as shown in FIG. 32 (after the photo resist 112 and oxide 110 are removed).

It is to be understood that the present invention is not limited to the embodiment(s) described above and illustrated herein. For example, references to the present invention herein are not intended to limit the scope of any claim or claim term, but instead merely make reference to one or more features that may be covered by one or more claims. Materials, processes and numerical examples described above are exemplary only, and should not be deemed to limit any claims. Further, not all method steps need be performed in the exact order illustrated. Single layers of material could be formed as multiple layers of such or similar materials, and vice versa. Lastly, while invention is described with respect to a specific four gate, split gate, memory cell configuration, it is equally applicable to any memory cell configuration that has an overall height greater than that of the accompanying logic devices.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A memory device, comprising:
   a semiconductor substrate having a memory area and a logic device area, wherein an upper surface of the substrate in the memory area is recessed lower than an upper surface of the substrate in the logic device area;
   a plurality of memory cells formed in the memory area of the substrate, wherein each of the memory cells includes:
     a first source region formed in the substrate,
     a first drain region formed in the substrate, wherein a first channel region is defined in the substrate between the first source region and the first drain region,
     a floating gate disposed over and insulated from a first portion of the first channel region that is adjacent to the first source region,
     a control gate disposed over and insulated from the floating gate,
     a select gate disposed over and insulated from a second portion of the first channel region that is adjacent to the first drain region, and
     an erase gate disposed over and insulated from the first source region;
   a plurality of logic devices formed in the logic device area of the substrate, wherein each of the logic devices includes:
     a second source region formed in the substrate,
     a second drain region formed in the substrate, wherein a second channel region is defined in the substrate between the second source region and the second drain region, and
     a logic gate disposed over and insulated from the second channel region.

2. The memory device of claim 1, wherein top surfaces of the select gates are even with top surfaces of the logic gates relative to the substrate.

3. The memory device of claim 2, further comprising:
   a plurality of blocks of insulation material each disposed over one of the control gates, wherein top surfaces of the blocks of insulation are even with the top surfaces of the select gates and with the top surfaces of the logic gates relative to the substrate.

4. The memory device of claim 1, wherein:
   the floating gates, the erase gates and the control gates are formed of polysilicon; and
   the select gates and the logic gates are formed of a metal material.

5. A memory device, comprising:
   a semiconductor substrate having a memory area and a logic device area, wherein an upper surface of the substrate in the memory area is recessed lower than an upper surface of the substrate in the logic device area:
   a plurality of memory cells formed in the memory area of the substrate, wherein each of the memory cells includes:
     a first source region formed in the substrate,
     a first drain region formed in the substrate, wherein a first channel region is defined in the substrate between the first source region and the first drain region,
     a floating gate disposed over and insulated from a first portion of the first channel region that is adjacent to the first source region,
     a control gate disposed over and insulated from the floating gate,
     a select gate disposed over and insulated from a second portion of the first channel region that is adjacent to the first drain region, and an erase gate disposed over and insulated from the first source region:
   a plurality of logic devices formed in the logic device area of the substrate, wherein each of the logic devices includes:
     a second source region formed in the substrate,
     a second drain region formed in the substrate, wherein a second channel region is defined in the substrate between the second source region and the second drain region, and
     a logic gate disposed over and insulated from the second channel region: wherein:
   the floating gates, the erase gates and the control gates are formed of polysilicon,
   the select gates and the logic gates are formed of a metal material, and
   the select gates are insulated from the substrate by at least a layer of oxide and a layer of high K material.

6. The memory device of claim 1, further comprising:
   a layer of silicide on an upper surface of each of the erase gates;
   a layer of silicide on portions of the substrate surface over the first drain regions; and
   a layer of silicide on portions of the substrate surface over the second source regions and the second drain regions.

7. A method of forming a memory device, comprising:
forming one or more protective layers on a surface of a semiconductor substrate having a memory area and a logic device area;
removing the one or more protective layers from the memory device area of the substrate while preserving the one or more protective layers in the logic device area of the substrate;
performing an oxidation process that forms an oxide layer on the substrate surface in the memory area, wherein the oxidation process consumes and lowers a height of the substrate surface in the memory area such that the surface of the substrate in the memory area is recessed lower than the surface of the substrate in the logic device area;
removing the one or more protective layers from the logic device area of the substrate;
removing the oxide layer from the memory area of the substrate; forming a plurality of memory cells in the memory area of the substrate, wherein each of the memory cells includes:
a first source region formed in the substrate,
a first drain region formed in the substrate, wherein a first channel region is defined in the substrate between the first source region and the first drain region,
a floating gate disposed over and insulated from a first portion of the first channel region that is adjacent to the first source region,
a control gate disposed over and insulated from the floating gate,
a select gate disposed over and insulated from a second portion of the first channel region that is adjacent to the first drain region, and
an erase gate disposed over and insulated from the first source region;
forming a plurality of logic devices in the logic device area of the substrate, wherein each of the logic devices includes:
a second source region formed in the substrate,
a second drain region formed in the substrate, wherein a second channel region is defined in the substrate between the second source region and the second drain region, and
a logic gate disposed over and insulated from the second channel region.

8. The method of claim 7, wherein top surfaces of the select gates are even with top surfaces of the logic gates relative to the substrate.

9. The method of claim 8, further comprising:
forming a plurality of blocks of insulation material each disposed over one of the control gates, wherein top surfaces of the blocks of insulation are even with the top surfaces of the select gates and with the top surfaces of the logic gates relative to the substrate.

10. The method of claim 7, wherein:
the floating gates, the erase gates and the control gates are formed of polysilicon; and
the select gates and the logic gates are formed of a metal material.

11. A method of claim 10 forming a memory device, comprising:
forming one or more protective layers on a surface of a semiconductor substrate having a memory area and a logic device area;
removing the one or more protective layers from the memory device area of the substrate while preserving the one or more protective layers in the logic device area of the substrate;
performing an oxidation process that forms an oxide layer on the substrate surface in the memory area, wherein the oxidation process consumes and lowers a height of the substrate surface in the memory area such that the surface of the substrate in the memory area is recessed lower than the surface of the substrate in the logic device area;
removing the one or more protective layers from the logic device area of the substrate: removing the oxide layer from the memory area of the substrate;
forming a plurality of memory cells in the memory area of the substrate, wherein each of the memory cells includes:
a first source region formed in the substrate,
a first drain region formed in the substrate, wherein a first channel region is defined in the substrate between the first source region and the first drain region,
a floating gate disposed over and insulated from a first portion of the first channel region that is adjacent to the first source region,
a control gate disposed over and insulated from the floating gate,
a select gate disposed over and insulated from a second portion of the first channel region that is adjacent to the first drain region, and
an erase gate disposed over and insulated from the first source region;
forming a plurality of logic devices in the logic device area of the substrate, wherein each of the logic devices includes:
a second source region formed in the substrate, a second drain region formed in the substrate, wherein a second channel region is defined in the substrate between the second source region and the second drain region, and
a logic gate disposed over and insulated from the second channel region: wherein:
the floating gates, the erase gates and the control gates are formed of polysilicon, the select gates and the logic gates are formed of a metal material, and
the select gates are insulated from the substrate by at least a layer of oxide and a layer of high K material.

12. The method of claim 7, further comprising:
forming a layer of silicide on an upper surface of each of the erase gates;
forming a layer of silicide on portions of the substrate surface over the first drain regions; and
forming a layer of silicide on portions of the substrate surface over the second source regions and the second drain regions.

13. A method of forming a memory device, comprising:
forming one or more protective layers on a surface of a semiconductor substrate having a memory area and a logic device area;
removing the one or more protective layers from the logic device area of the substrate while preserving the one or more protective layers in the memory area of the substrate;
performing an epitaxial growth process that grows silicon on the substrate surface in the logic area, wherein the epitaxial growth process raises a height of the substrate surface in the logic device area such that the surface of the substrate in the logic device area is raised higher than the surface of the substrate in the memory area;

removing the one or more protective layers from the memory area of the substrate;

forming a plurality of memory cells in the memory area of the substrate, wherein each of the memory cells includes:
- a first source region formed in the substrate,
- a first drain region formed in the substrate, wherein a first channel region is defined in the substrate between the first source region and the first drain region,
- a floating gate disposed over and insulated from a first portion of the first channel region that is adjacent to the first source region,
- a control gate disposed over and insulated from the floating gate,
- a select gate disposed over and insulated from a second portion of the first channel region that is adjacent to the first drain region, and
- an erase gate disposed over and insulated from the first source region;

forming a plurality of logic devices in the logic device area of the substrate, wherein each of the logic devices includes:
- a second source region formed in the substrate,
- a second drain region formed in the substrate, wherein a second channel region is defined in the substrate between the second source region and the second drain region, and
- a logic gate disposed over and insulated from the second channel region.

14. The method of claim 13, wherein top surfaces of the select gates are even with top surfaces of the logic gates relative to the substrate.

15. The method of claim 14, further comprising:
forming a plurality of blocks of insulation material each disposed over one of the control gates, wherein top surfaces of the blocks of insulation are even with the top surfaces of the select gates and with the top surfaces of the logic gates relative to the substrate.

16. The method of claim 13, wherein:
the floating gates, the erase gates and the control gates are formed of polysilicon; and
the select gates and the logic gates are formed of a metal material.

17. A method of forming a memory device, comprising:
forming one or more protective layers on a surface of a semiconductor substrate having a memory area and a logic device area;
removing the one or more protective layers from the logic device area of the substrate while preserving the one or more protective layers in the memory area of the substrate;
performing an epitaxial growth process that grows silicon on the substrate surface in the logic area, wherein the epitaxial growth process raises a height of the substrate surface in the logic device area such that the surface of the substrate in the logic device area is raised higher than the surface of the substrate in the memory area;

removing the one or more protective layers from the memory area of the substrate;

forming a plurality of memory cells in the memory area of the substrate, wherein each of the memory cells includes:
- a first source region formed in the substrate,
- a first drain region formed in the substrate, wherein a first channel region is defined in the substrate between the first source region and the first drain region,
- a floating gate disposed over and insulated from a first portion of the first channel region that is adjacent the source region,
- a control gate disposed over and insulated from the floating gate,
- a select gate disposed over and insulated from a second portion of the first channel region that is adjacent to the drain region, and
- an erase gate disposed over and insulated from the source region;

forming a plurality of logic devices in the logic device area of the substrate, wherein each of the logic devices includes:
- a second source region formed in the substrate,
- a second drain region formed in the substrate, wherein a second channel region is defined in the substrate between the second source region and the second drain region, and
- a logic gate disposed over and insulated from the second channel region; wherein:

the floating gates, the erase gates and the control gates are formed of polysilicon,
the select gates and the logic gates are formed of a metal material, and
the select gates are insulated from the substrate by at least a layer of oxide and a layer of high K material.

18. The method of claim 13, further comprising:
forming a layer of silicide on an upper surface of each of the erase gates;
forming a layer of silicide on portions of the substrate surface over the first drain regions; and
forming a layer of silicide on portions of the substrate surface over the second source regions and the second drain regions.

* * * * *